(12) United States Patent
Yang et al.

(10) Patent No.: US 12,107,084 B2
(45) Date of Patent: Oct. 1, 2024

(54) MULTI-CHANNEL TRANSIENT VOLTAGE SUPPRESSION DEVICE (71) Applicant: AMAZING MICROELECTRONIC CORP., New Taipei (TW)

(72) Inventors: Tun-Chih Yang, New Taipei (TW); Zi-Ping Chen, New Taipei (TW); Kun-Hsien Lin, Zhubei (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 394 days.

(21) Appl. No.: 17/368,269

(22) Filed: Jul. 6, 2021

(65) Prior Publication Data

US 2023/0010423 A1    Jan. 12, 2023

(51) Int. Cl.
*H01L 27/02* (2006.01)

(52) U.S. Cl.
CPC ................ *H01L 27/0262* (2013.01)

(58) Field of Classification Search
CPC .................................. H01L 27/0262
See application file for complete search history.

(56) References Cited

U.S. PATENT DOCUMENTS

| 10,270,242 B2 | 4/2019 | Chen |
| 2004/0041215 A1 | 3/2004 | Chaine et al. |
| 2005/0006706 A1 | 1/2005 | Stefanov et al. |
| 2009/0090972 A1 | 4/2009 | Vinson |
| 2009/0115018 A1 | 5/2009 | Mallikarjunaswamy |
| 2011/0068364 A1 | 3/2011 | Abou-Khalil et al. |
| 2011/0163352 A1 | 7/2011 | Gee et al. |
| 2011/0210418 A1 | 9/2011 | Esmark |
| 2012/0012974 A1 | 1/2012 | Chuang et al. |
| 2012/0241930 A1 | 9/2012 | Liu et al. |
| 2016/0056147 A1 | 2/2016 | Li et al. |
| 2016/0181238 A1 | 6/2016 | Hung et al. |
| 2020/0027873 A1 | 1/2020 | Chen et al. |
| 2020/0035665 A1 | 1/2020 | Chuang et al. |

FOREIGN PATENT DOCUMENTS

| CN | 109616509 A | 4/2019 |
| CN | 110571213 A | 12/2019 |
| CN | 112216690 A | 1/2021 |

*Primary Examiner* — Tucker J Wright
(74) *Attorney, Agent, or Firm* — Birch, Stewart, Kolasch & Birch, LLP (57) ABSTRACT

A multi-channel transient voltage suppression device includes a semiconductor substrate, a semiconductor layer, at least two bidirectional transient voltage suppression structures, and at least one isolation trench. The semiconductor substrate, having a first conductivity type, is coupled to a grounding terminal. The semiconductor layer, having a second conductivity type opposite to the first conductivity type, is formed on the semiconductor substrate. The bidirectional transient voltage suppression structures are formed in the semiconductor layer. Each bidirectional transient voltage suppression structure is coupled to an input/output (I/O) pin and the grounding terminal. The isolation trench is formed in the semiconductor substrate and the semiconductor layer and formed between the bidirectional transient voltage suppression structures. The isolation trench has a height larger than the height of the semiconductor layer and surrounds the bidirectional transient voltage suppression structures.

4 Claims, 9 Drawing Sheets

MULTI-CHANNEL TRANSIENT VOLTAGE SUPPRESSION DEVICE

BACKGROUND OF THE INVENTION

Field of the Invention

The present invention relates to a transient voltage suppression device, particularly to a multi-channel transient voltage suppression device.

Description of the Related Art

Electrostatic Discharge (ESD) damage has become the main reliability issue for CMOS IC products fabricated in the nanoscale CMOS processes. ESD protection device is generally designed to bypass the ESD energy, so that the IC chips can be prevented from ESD damages.

Figure 1:
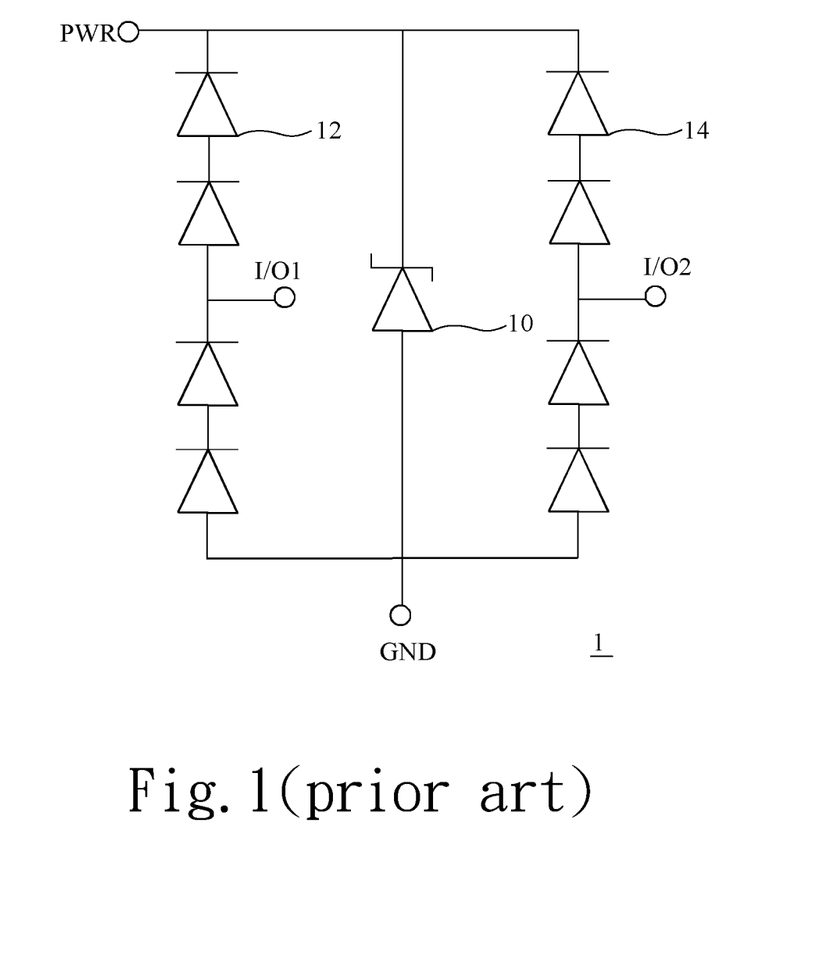
FIG. 1 is a schematic diagram illustrating a transient voltage suppressor in a conventional technology.

In conventional technical field, transient voltage suppressors (TVS) are usually used to conduct an ESD protection. Refer to FIG. 1. FIG. 1 illustrates a circuit diagram of a conventional low-capacitance transient voltage suppressor. The transient voltage suppressor 1 includes a power clamp device 10 and a plurality of first diodes 12 and a plurality of second diodes 14. In order to reduce equivalent capacitances on current dissipation paths provided by the transient voltage suppressor, one or more diodes are usually arranged between input output terminals I/O1 and I/O2 and a power terminal PWR and between the input output terminals I/O1 and I/O2 and a ground terminal GND in conventional technical field so the equivalent capacitances on the current dissipation paths may be reduced through parasitic capacitances on the diodes connected in series. However, as the number of channels of the transient voltage suppressor increases, the diodes additionally arranged on each channel may cause a circuit area required by the transient voltage suppressor to increase significantly and thereby dramatically increase circuit costs and serial resistance.

To overcome the abovementioned problems, the present invention provides a multi-channel transient voltage suppression device, so as to solve the afore-mentioned problems of the prior art.

SUMMARY OF THE INVENTION

The primary objective of the present invention is to provide a multi-channel transient voltage suppression device, which achieve a low-capacitance purpose and reduces a layout area, a serial resistance, and a cost without connecting to additional components in series.

To achieve the abovementioned objectives, the present invention provides a multi-channel transient voltage suppression device, which includes a semiconductor substrate, a semiconductor layer, at least two bidirectional transient voltage suppression structures, and at least one isolation trench. The semiconductor substrate, having a first conductivity type, is coupled to a grounding terminal. The semiconductor layer, having a second conductivity type opposite to the first conductivity type, is formed on the semiconductor substrate. The bidirectional transient voltage suppression structures are formed in the semiconductor layer. Each bidirectional transient voltage suppression structure is coupled to an input/output (I/O) pin and the grounding terminal. The isolation trench is formed in the semiconductor substrate and the semiconductor layer and formed between the bidirectional transient voltage suppression structures. The isolation trench has a height larger than the height of the semiconductor layer and surrounds the bidirectional transient voltage suppression structures.

In an embodiment of the present invention, each of the bidirectional transient voltage suppression structures includes a first doped well, a first doped area, a second doped area, a second doped well, a third doped area, and a fourth doped area. The first doped well, having the first conductivity type, is formed in the semiconductor layer. The first doped area, having the first conductivity type, is formed in the first doped well. The second doped area, having the second conductivity type, is formed in the first doped well. The first doped area and the second doped area are coupled to the I/O pin. The second doped well, having the first conductivity type, is formed in the semiconductor layer. The third doped area, having the second conductivity type, is formed in the second doped well. The fourth doped area, having the first conductivity type, is formed in the second doped well. The third doped area and the fourth doped area are coupled to the grounding terminal.

In an embodiment of the present invention, the shortest distance between the second doped area and the semiconductor substrate is larger than the shortest distance between the second doped area and the second doped well.

In an embodiment of the present invention, the shortest distance between the third doped area and the semiconductor substrate is larger than the shortest distance between the third doped area and the first doped well.

In an embodiment of the present invention, each of the bidirectional transient voltage suppression structures includes two doped areas having the first conductivity type. The doped areas are formed in the semiconductor layer and respectively coupled to the I/O pin and the grounding terminal.

In an embodiment of the present invention, the shortest distance between the doped areas is less than the shortest distance between each of the doped areas and the semiconductor substrate.

In an embodiment of the present invention, each of the bidirectional transient voltage suppression structures further includes a doped well having the second conductivity type. The doped well is formed in the semiconductor layer. The doped areas are formed in the doped well.

In an embodiment of the present invention, each of the bidirectional transient voltage suppression structures includes a doped well and two doped areas. The doped well, having the first conductivity type, is formed in the semiconductor layer. The doped areas, having the second conductivity type, are formed in the doped well and respectively coupled to the I/O pin and the grounding terminal.

In an embodiment of the present invention, the shortest distance between the doped areas is less than the shortest distance between each of the doped areas and the semiconductor substrate.

In an embodiment of the present invention, the first conductivity type and the second conductivity type are respectively an N type and a P type.

In an embodiment of the present invention, the first conductivity type and the second conductivity type are respectively a P type and an N type.

To sum up, the multi-channel transient voltage suppression device uses a single bidirectional transient voltage suppression structure to achieve a low-capacitance purpose and reduces a layout area, a serial resistance, and a cost without connecting to additional components in series. Besides, the multi-channel transient voltage suppression device forms the isolation trench to isolate the semiconductor layer and the shallower layer of the semiconductor substrate thereunder that is grounded, so as to reduce parasitic capacitances.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

In the following description, a multi-channel transient voltage suppression device will be provided. In the multi-channel transient voltage suppression device, a single bidirectional transient voltage suppression structure is used to achieve a low-capacitance purpose and reduces a layout area, a serial resistance, and a cost without connecting to additional components in series. Besides, the multi-channel transient voltage suppression device forms an isolation trench to divide a semiconductor layer and the shallower layer of a semiconductor substrate thereunder that is grounded, so as to reduce parasitic capacitances. The multi-channel transient voltage suppression devices provided below may also be applied to other circuit configurations.

Figure 2:
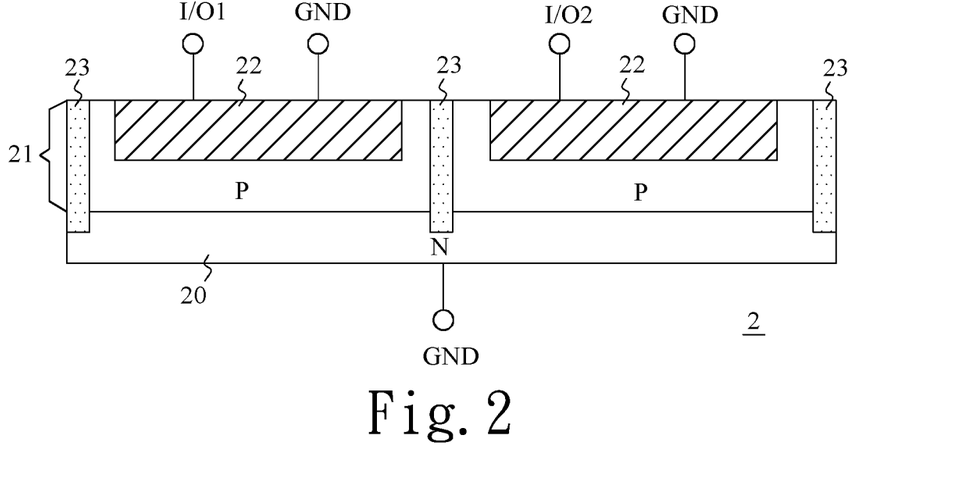
FIG. 2 is a diagram schematically illustrating a multi-channel transient voltage suppression device according to a first embodiment of the present invention.

FIG. 2 is a diagram schematically illustrating a multi-channel transient voltage suppression device according to a first embodiment of the invention. Referring to FIG. 2, a multi-channel transient voltage suppression device 2 is introduced as follows. The multi-channel transient voltage suppression device 2 includes a semiconductor substrate 20, a semiconductor layer 21, at least two bidirectional transient voltage suppression structures 22, and at least one isolation trench 23. The isolation trench 23 includes an insulation material. For clarity and convenience, the first embodiment exemplifies two bidirectional transient voltage suppression structures 22 and one isolation trench 23. The semiconductor substrate 20, having a first conductivity type, is coupled to a grounding terminal GND. The semiconductor layer 21, having a second conductivity type opposite to the first conductivity type, is formed on the semiconductor substrate 20. In the first embodiment, the first conductivity type and the second conductivity type can be respectively exemplified by an N type and a P type. The bidirectional transient voltage suppression structures 22 are formed in the semiconductor layer 21. Each bidirectional transient voltage suppression structure 22 and the semiconductor layer 21 form a bidirectional transient voltage suppressor. The bidirectional transient voltage suppressor has parasitic capacitances and cooperates with the semiconductor substrate 20 to form a parasitic capacitance. Each bidirectional transient voltage suppression structure 22 is coupled to an input/output (I/O) pin I/O1 or I/O2 and the grounding terminal GND. The isolation trench 23 is formed in the semiconductor substrate 20 and the semiconductor layer 21 and formed between the bidirectional transient voltage suppression structures 22. The isolation trench 23 has a height larger than the height of the semiconductor layer 21 and surrounds the bidirectional transient voltage suppression structures 22. Since the isolation trench 23 isolates all the bidirectional transient voltage suppression structures 22 and the shallower layer of the semiconductor substrate 20 and the semiconductor substrate 20 electrically connects to the grounding terminal GND, the parasitic capacitances formed by the bidirectional transient voltage suppressors and the semiconductor substrate 20 are disconnected from each other. As a result, the multi-channel transient voltage suppression device 2 can reduce the parasitic capacitances corresponding to each I/O pin, a layout area, a serial resistance, and a layout cost without connecting to additional components in series.

In the operation of the first embodiment, an electrostatic discharge (ESD) current flows from the I/O pin to the grounding terminal GND through the bidirectional transient voltage suppression structure 22 when a positive ESD voltage appears at the I/O pin. An ESD current flows from the grounding terminal GND to the I/O pin through the bidirectional transient voltage suppression structure 22 when a positive ESD voltage appears at the grounding terminal GND.

Figure 3:
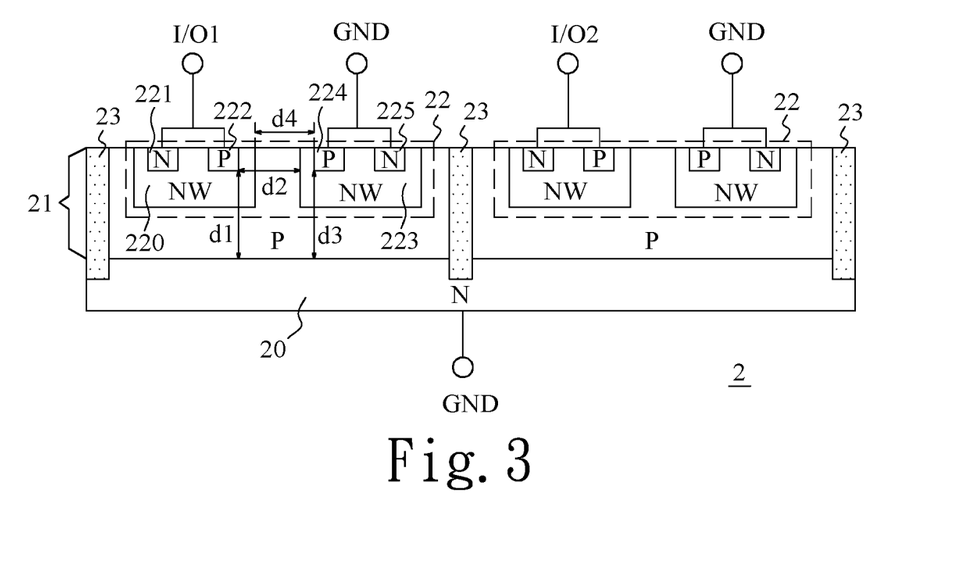
FIG. 3 is a diagram schematically illustrating a multi-channel transient voltage suppression device according to a second embodiment of the present invention.

FIG. 3 is a diagram schematically illustrating a multi-channel transient voltage suppression device according to a second embodiment of the present invention. Referring to FIG. 3, the multi-channel transient voltage suppression device 2 is introduced as follows. The second embodiment is different from the first embodiment in the bidirectional transient voltage suppression structure 22. In the second embodiment, the bidirectional transient voltage suppression structure 22 may include a first doped well 220, a first doped area 221, a second doped area 222, a second doped well 223, a third doped area 224, and a fourth doped area 225. The bidirectional transient voltage suppression structure 22 and the semiconductor layer 21 form a silicon-controlled rectifier (SCR) as the bidirectional transient voltage suppressor. The first doped well 220, having the first conductivity type, is formed in the semiconductor layer 21. The first doped area 221, having the first conductivity type, is formed in the first doped well 220. The second doped area 222, having the second conductivity type, is formed in the first doped well 220. The first doped area 221 and the second doped area 222 are coupled to the I/O pin I/O1 or I/O2. The second doped well 223, having the first conductivity type, is formed in the semiconductor layer 21. The third doped area 224, having the second conductivity type, is formed in the second doped well 223. The fourth doped area 225, having the first conductivity type, is formed in the second doped well 223. The third doped area 224 and the fourth doped area 225 are coupled to the grounding terminal GND. The second doped area 222, the first doped well 220, the semiconductor layer 21, the second doped well 223, and the fourth doped area 225 form a first horizontal SCR. The second doped area 222, the first doped well 220, the semiconductor layer 21, and the semiconductor substrate 20 form a first vertical SCR. As a result, the shortest distance d1 between the second doped area 222 and the semiconductor substrate 20 may be larger than the shortest distance d2 between the second doped area 222 and the second doped well 223 in order to avoid turning on the first vertical SCR. Similarly, the third doped area 224, the second doped well 223, the semiconductor layer 21, the first doped well 220, and the first doped area 221 form a second horizontal SCR. The third doped area 224, the second doped well 223, the semiconductor layer 21, and the semiconductor substrate 20 form a second vertical SCR. As a result, the shortest distance d3 between the third doped area 224 and the semiconductor substrate 20 may be larger than the shortest distance d4 between the third doped area 224 and the first doped well 220 in order to avoid turning on the second vertical SCR.

Figure 4:
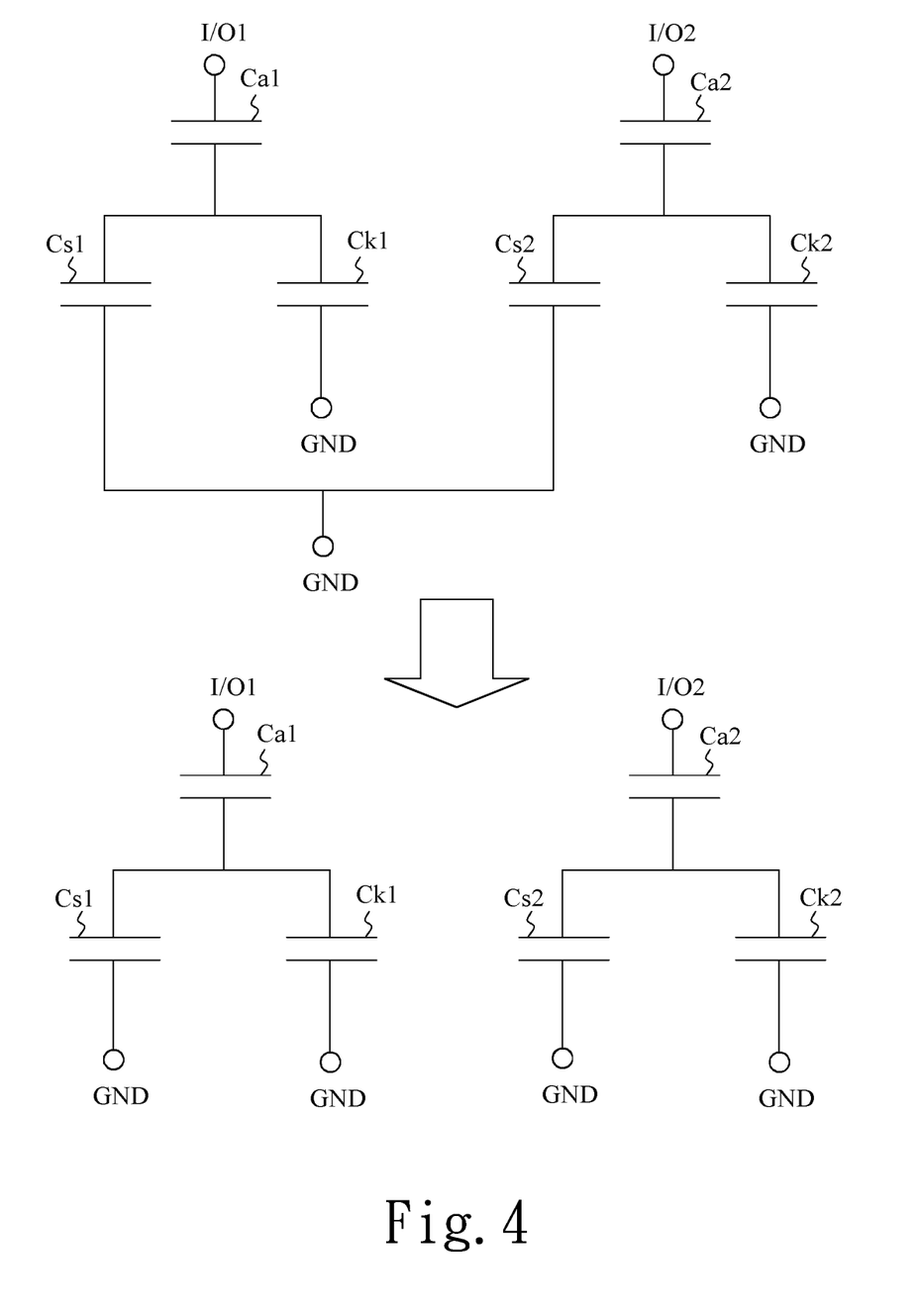
FIG. 4 is a diagram schematically illustrating an equivalent circuit of a multi-channel transient voltage suppression device according to an embodiment of the present invention.

FIG. 4 is a diagram schematically illustrating an equivalent circuit of a multi-channel transient voltage suppression device according to an embodiment of the present invention. Referring to FIG. 3 and FIG. 4, the first doped well 220 and the semiconductor layer 21 form a parasitic junction capacitance $Ca1$ or $Ca2$. The second doped well 223 and the semiconductor layer 21 form a parasitic junction capacitance $Ck1$ or $Ck2$. The semiconductor layer 21 and the semiconductor substrate 20 form a parasitic junction capacitance $Cs1$ or $Cs2$. The parasitic junction capacitance $Cs1$ is connected to the parasitic junction capacitance $Ck1$ in parallel to form a first equivalent capacitance. The first equivalent capacitance is connected to the parasitic junction capacitance $Ca1$ in series. The parasitic junction capacitance $Cs2$ is connected to the parasitic junction capacitance $Ck2$ in parallel to form a second equivalent capacitance. The second equivalent capacitance is connected to the parasitic junction capacitance $Ca2$ in series. Since the parasitic junction capacitances $Cs1$ and $Cs2$ are connected to the grounding terminal GND, the parasitic junction capacitance $Cs1$ is disconnected from the parasitic junction capacitances $Cs2$. As a result, the multi-channel transient voltage suppression device 2 can reduce the parasitic capacitances corresponding to each I/O pin, a layout area, a serial resistance, and a layout cost without connecting to additional components in series.

In the operation of the second embodiment, an electrostatic discharge (ESD) current flows from the I/O pin to the grounding terminal GND through the second doped area 222, the first doped well 220, the semiconductor layer 21, the second doped well 223, and the fourth doped area 225 when a positive ESD voltage appears at the I/O pin. An ESD current flows from the grounding terminal GND to the I/O pin through the third doped area 224, the second doped well 223, the semiconductor layer 21, the first doped well 220, and the first doped area 221 when a positive ESD voltage appears at the grounding terminal GND.

Figure 5:
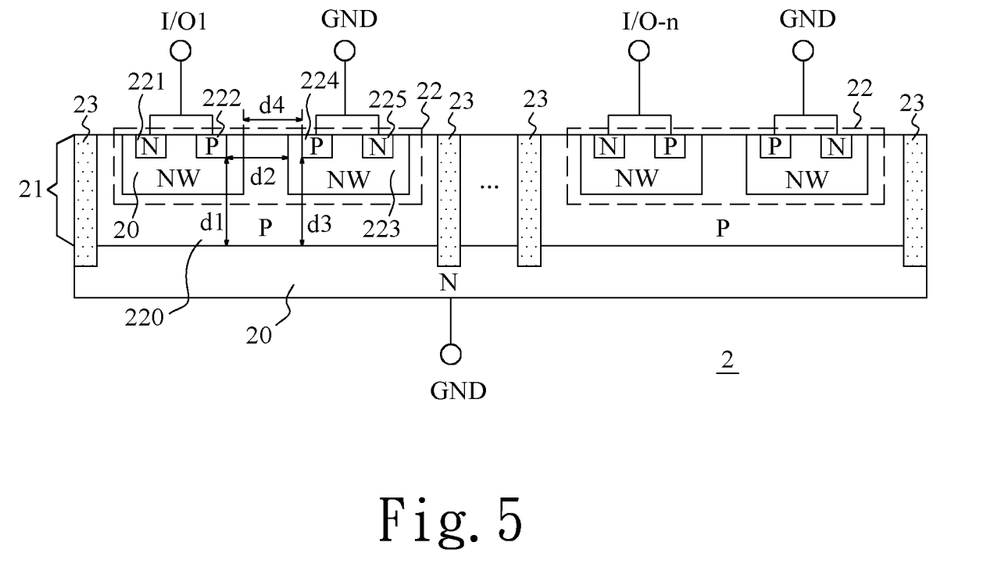
FIG. 5 is a diagram schematically illustrating a multi-channel transient voltage suppression device according to a third embodiment of the present invention.

FIG. 5 is a diagram schematically illustrating a multi-channel transient voltage suppression device according to a third embodiment of the present invention. Referring to FIG. 5, third embodiment is different from the second embodiment in the number of the bidirectional transient voltage suppression structures 22. In the third embodiment, the number of the bidirectional transient voltage suppression structures 22 is larger than two.

Figure 6:
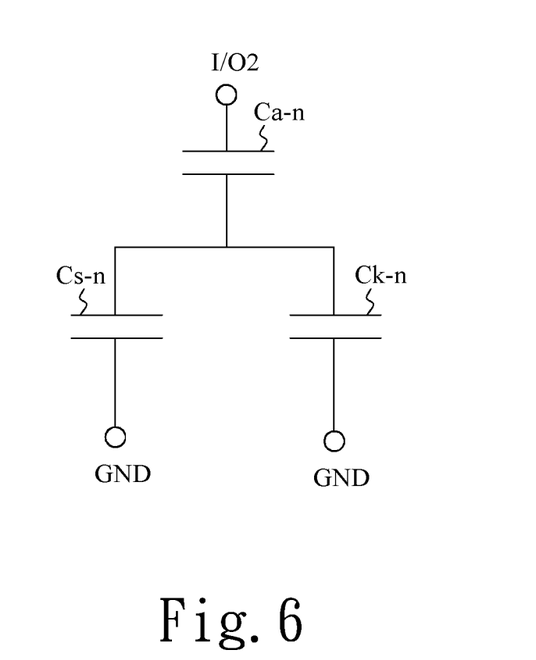
FIG. 6 is a diagram schematically illustrating an equivalent circuit of a transient voltage suppression structure, a semiconductor layer, and a semiconductor substrate according to an embodiment of the present invention.

FIG. 6 is a diagram schematically illustrating an equivalent circuit of a transient voltage suppression structure, a semiconductor layer, and a semiconductor substrate according to an embodiment of the present invention. Referring to FIG. 5 and FIG. 6, the first doped well 220 and the semiconductor layer 21 form a parasitic junction capacitance Ca-n. The second doped well 223 and the semiconductor layer 21 form a parasitic junction capacitance Ck-n. The semiconductor layer 21 and the semiconductor substrate 20 form a parasitic junction capacitance Cs-n. The parasitic junction capacitance Cs-n is connected to the parasitic junction capacitance Ck-n in parallel to form an equivalent capacitance. The equivalent capacitance is connected to the parasitic junction capacitance Ca-n in series. Since all the parasitic junction capacitances Cs-n are connected to the grounding terminal GND, the parasitic junction capacitances Cs-n are disconnected from each other. As a result, the multi-channel transient voltage suppression device 2 can reduce the parasitic capacitances corresponding to each I/O pin, a layout area, a serial resistance, and a layout cost without connecting to additional components in series.

The operation of the third embodiment is the same as the operation of the second embodiment so will not be reiterated.

Figure 7:
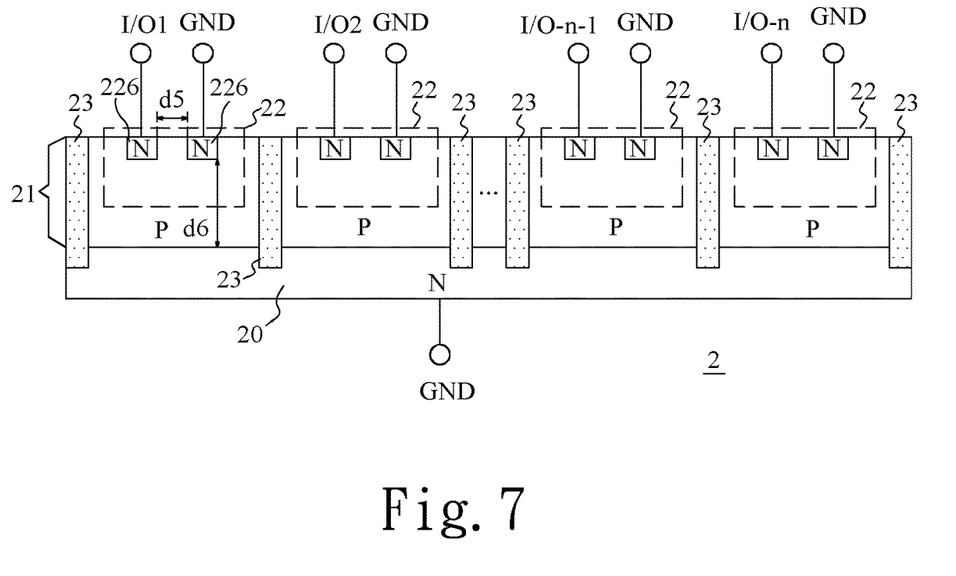
FIG. 7 is a diagram schematically illustrating a multi-channel transient voltage suppression device according to a fourth embodiment of the present invention.

FIG. 7 is a diagram schematically illustrating a multi-channel transient voltage suppression device according to a fourth embodiment of the present invention. Referring to FIG. 7, the multi-channel transient voltage suppression device 2 is introduced as follows. The fourth embodiment is different from the third embodiment in the bidirectional transient voltage suppression structure 22. In the fourth embodiment, the bidirectional transient voltage suppression structure 22 may include two doped areas 226 having the first conductivity type. The bidirectional transient voltage suppression structure 22 and the semiconductor layer 21 form a bipolar junction transistor (BJT) as the bidirectional transient voltage suppressor. The doped areas 226 are formed in the semiconductor layer 21 and respectively coupled to the I/O pin I/O1, . . . , or I/O-n and the grounding terminal GND. The doped areas 226 and the semiconductor layer 21 form a horizontal BJT. The doped areas 226, the semiconductor layer 21, and the semiconductor substrate 20 form vertical BJTs. As a result, the shortest distance d5 between the doped areas 226 may be less than the shortest distance d6 between each doped area 226 and the semiconductor substrate 20 in order to avoid turning on the vertical BJT.

Referring to FIG. 7 and FIG. 6, the doped areas 226 and the semiconductor layer 21 form parasitic junction capacitances Ca-n and Ck-n. The semiconductor layer 21 and the semiconductor substrate 20 form a parasitic junction capacitance Cs-n. The parasitic junction capacitance Cs-n is connected to the parasitic junction capacitance Ck-n in parallel to form an equivalent capacitance. The equivalent capacitance is connected to the parasitic junction capacitance Ca-n in series. Since all the parasitic junction capacitances Cs-n are connected to the grounding terminal GND, the parasitic junction capacitances Cs-n are disconnected from each other. As a result, the multi-channel transient voltage suppression device 2 can reduce the parasitic capacitances corresponding to each I/O pin, a layout area, a serial resistance, and a layout cost without connecting to additional components in series.

In the operation of the fourth embodiment, an electrostatic discharge (ESD) current flows from the I/O pin to the grounding terminal GND through the doped area 226, the semiconductor layer 21, and the doped area 226 when a positive ESD voltage appears at the I/O pin. An ESD current flows from the grounding terminal GND to the I/O pin through the doped area 226, the semiconductor layer 21, and the doped area 226 when a positive ESD voltage appears at the grounding terminal GND.

Figure 8:
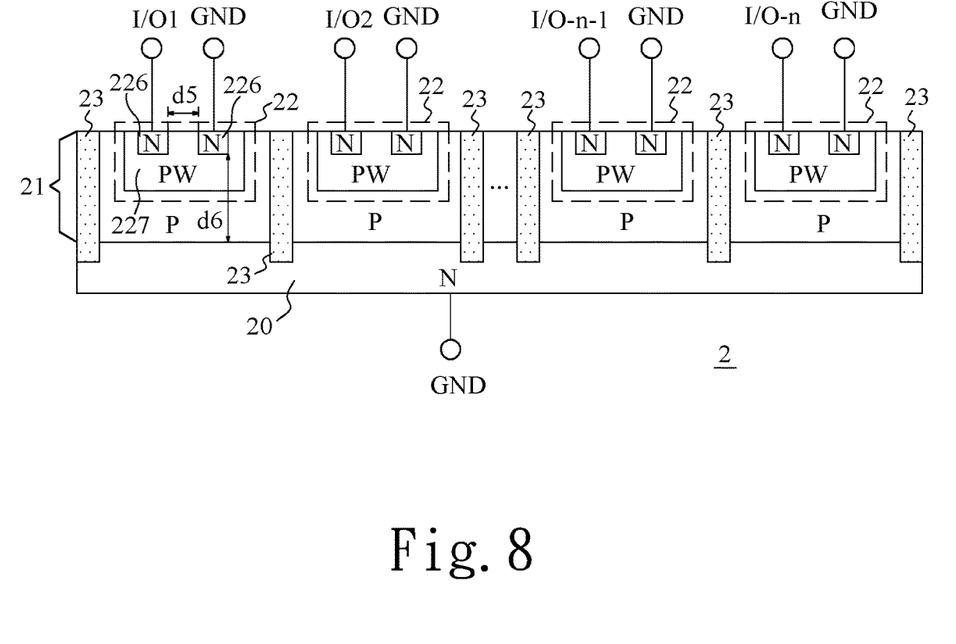
FIG. 8 is a diagram schematically illustrating a multi-channel transient voltage suppression device according to a fifth embodiment of the present invention.

FIG. 8 is a diagram schematically illustrating a multi-channel transient voltage suppression device according to a fifth embodiment of the present invention. Referring to FIG. 8, the multi-channel transient voltage suppression device 2 is introduced as follows. The fifth embodiment is different from the fourth embodiment in the bidirectional transient voltage suppression structure 22. Compared with the fourth embodiment, the bidirectional transient voltage suppression structure 22 of the fifth embodiment may further include a doped well 227 having the second conductivity type. The doped well 227 is formed in the semiconductor layer 21. The doped areas 226 are formed in the doped well 227. The doped areas 226 and the doped well 227 form a horizontal BJT. The doped areas 226, doped well 227, the semiconductor layer 21, and the semiconductor substrate 20 form vertical BJTs. As a result, the shortest distance d5 between the doped areas 226 may be less than the shortest distance d6 between each doped area 226 and the semiconductor substrate 20 in order to avoid turning on the vertical BJT.

Referring to FIG. 8 and FIG. 6, the doped areas 226 and the doped well 227 form parasitic junction capacitances Ca-n and Ck-n. The semiconductor layer 21 and the semiconductor substrate 20 form a parasitic junction capacitance Cs-n. The parasitic junction capacitance Cs-n is connected to the parasitic junction capacitance Ck-n in parallel to form an equivalent capacitance. The equivalent capacitance is connected to the parasitic junction capacitance Ca-n in series. Since all the parasitic junction capacitances Cs-n are connected to the grounding terminal GND, the parasitic junction capacitances Cs-n are disconnected from each other. As a result, the multi-channel transient voltage suppression device 2 can reduce the parasitic capacitances corresponding to each I/O pin, a layout area, a serial resistance, and a layout cost without connecting to additional components in series.

In the operation of the fifth embodiment, an electrostatic discharge (ESD) current flows from the I/O pin to the grounding terminal GND through the doped area 226, the doped well 227, and the doped area 226 when a positive ESD voltage appears at the I/O pin. An ESD current flows from the grounding terminal GND to the I/O pin through the doped area 226, the doped well 227, and the doped area 226 when a positive ESD voltage appears at the grounding terminal GND.

Figure 9:
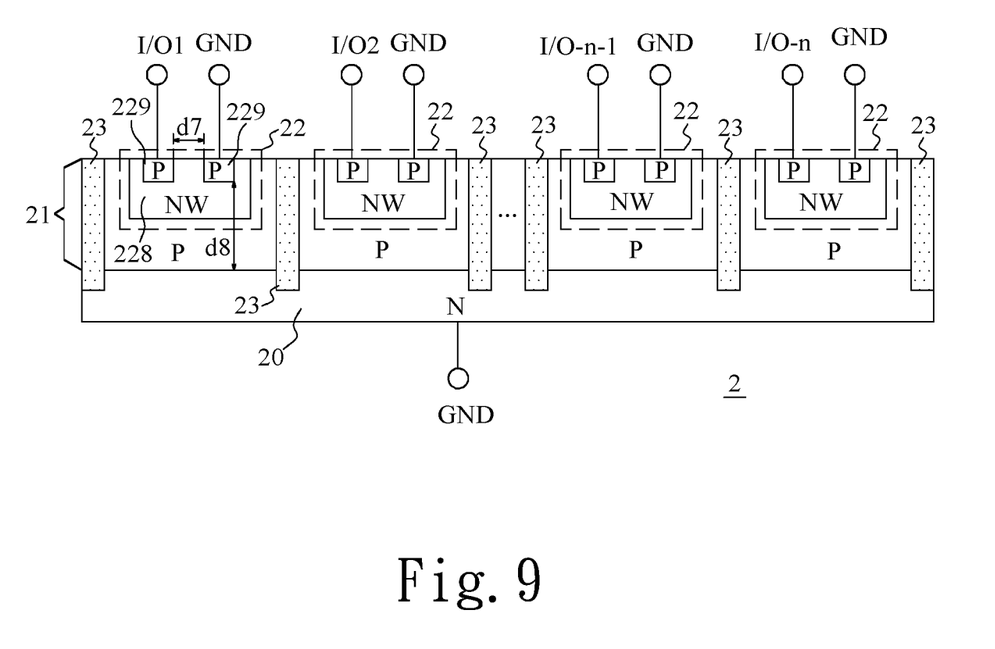
FIG. 9 is a diagram schematically illustrating a multi-channel transient voltage suppression device according to a sixth embodiment of the present invention.

FIG. 9 is a diagram schematically illustrating a multi-channel transient voltage suppression device according to a sixth embodiment of the present invention. Referring to FIG.

9, the multi-channel transient voltage suppression device 2 is introduced as follows. The sixth embodiment is different from the third embodiment in the bidirectional transient voltage suppression structure 22. In the sixth embodiment, the bidirectional transient voltage suppression structure 22 may include a doped well 228 and two doped areas 229. The bidirectional transient voltage suppression structure 22 and the semiconductor layer 21 form a bipolar junction transistor (BJT) as the bidirectional transient voltage suppressor. The doped well 228, having the first conductivity type, is formed in the semiconductor layer 21. The doped areas 229, having the second conductivity type, is formed in the doped well 228 and respectively coupled to the I/O pin I/O1, ..., or I/O-n and the grounding terminal GND. The doped areas 229 and the doped well 228 form a horizontal BJT. The doped areas 229, the doped well 228, the semiconductor layer 21, and the semiconductor substrate 20 form vertical BJTs. As a result, the shortest distance d7 between the doped areas 229 may be less than the shortest distance d8 between each doped areas 229 and the semiconductor substrate 20 in order to avoid turning on the vertical BJT.

Referring to FIG. 9 and FIG. 6, the doped areas 229 and the doped well 228 form parasitic junction capacitances Ca-n and Ck-n. The semiconductor layer 21 and the semiconductor substrate 20 form a parasitic junction capacitance Cs-n. The parasitic junction capacitance Cs-n is connected to the parasitic junction capacitance Ck-n in parallel to form an equivalent capacitance. The equivalent capacitance is connected to the parasitic junction capacitance Ca-n in series. Since all the parasitic junction capacitances Cs-n are connected to the grounding terminal GND, the parasitic junction capacitances Cs-n are disconnected from each other. As a result, the multi-channel transient voltage suppression device 2 can reduce the parasitic capacitances corresponding to each I/O pin, a layout area, a serial resistance, and a layout cost without connecting to additional components in series.

In the operation of the sixth embodiment, an electrostatic discharge (ESD) current flows from the I/O pin to the grounding terminal GND through the doped area 229, the doped well 228, and the doped area 229 when a positive ESD voltage appears at the I/O pin. An ESD current flows from the grounding terminal GND to the I/O pin through the doped area 229, the doped well 228, and the doped area 229 when a positive ESD voltage appears at the grounding terminal GND.

Figure 10:
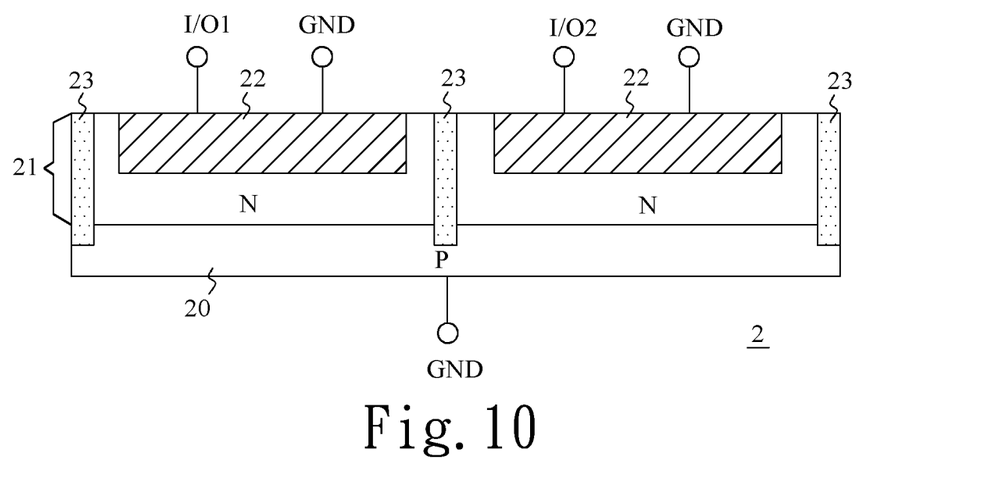
FIG. 10 is a diagram schematically illustrating a multi-channel transient voltage suppression device according to a seventh embodiment of the present invention.

FIG. 10 is a diagram schematically illustrating a multi-channel transient voltage suppression device according to a seventh embodiment of the present invention. Referring to FIG. 10, the seventh embodiment is different from the first embodiment in the conductivity type. In the seventh embodiment, the first conductivity type and the second conductivity type are respectively a P type and an N type. The other features of the seventh embodiment have been described previously so will not be reiterated.

Figure 11:
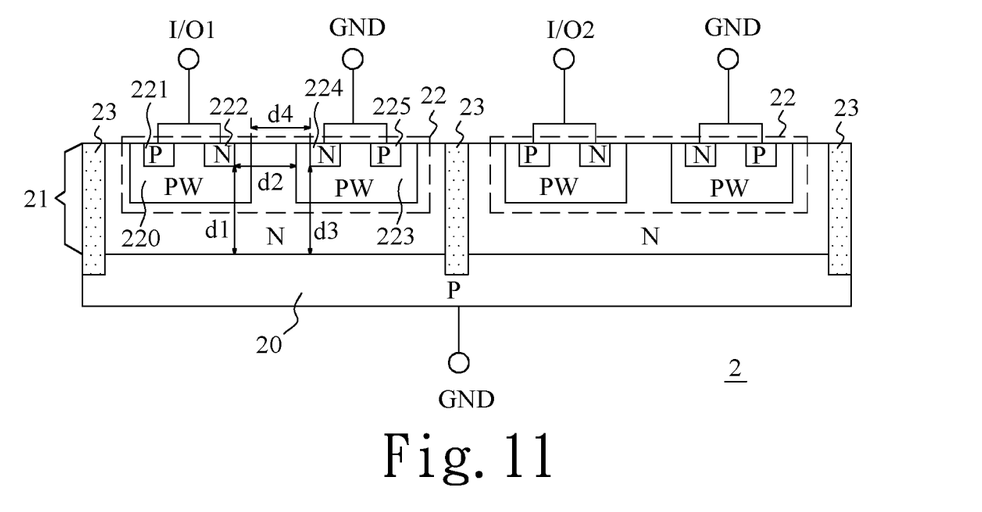
FIG. 11 is a diagram schematically illustrating a multi-channel transient voltage suppression device according to an eighth embodiment of the present invention.

FIG. 11 is a diagram schematically illustrating a multi-channel transient voltage suppression device according to an eighth embodiment of the present invention. Referring to FIG. 11, the eighth embodiment is different from the second embodiment in the conductivity type. In the eighth embodiment, the first conductivity type and the second conductivity type are respectively a P type and an N type. The other features of the eighth embodiment have been described previously so will not be reiterated.

Figure 12:
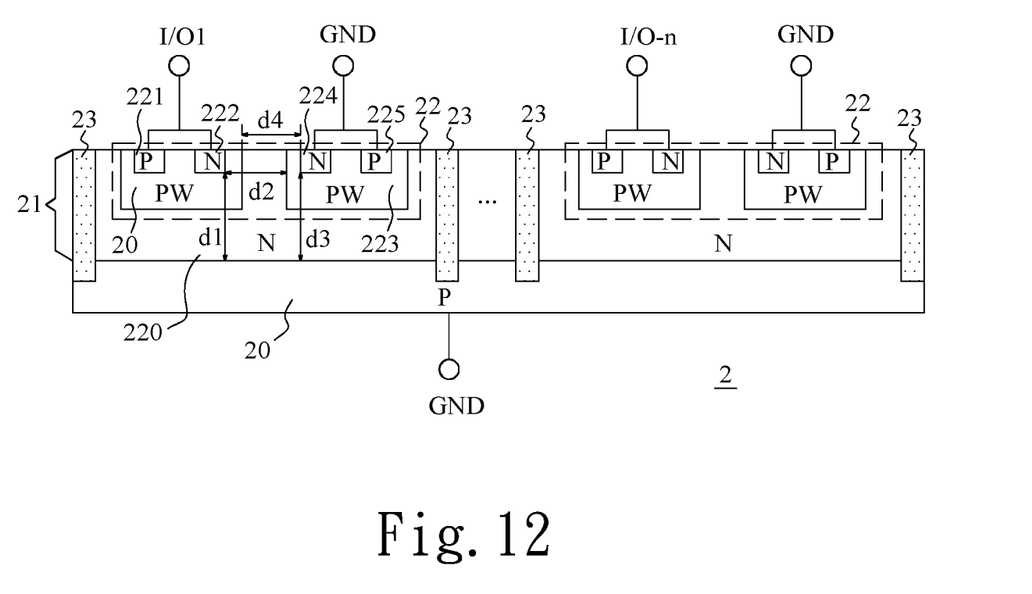
FIG. 12 is a diagram schematically illustrating a multi-channel transient voltage suppression device according to a ninth embodiment of the present invention.

FIG. 12 is a diagram schematically illustrating a multi-channel transient voltage suppression device according to a ninth embodiment of the present invention. Referring to FIG. 12, the ninth embodiment is different from the third embodiment in the conductivity type. In the ninth embodiment, the first conductivity type and the second conductivity type are respectively a P type and an N type. The other features of the ninth embodiment have been described previously so will not be reiterated.

Figure 13:
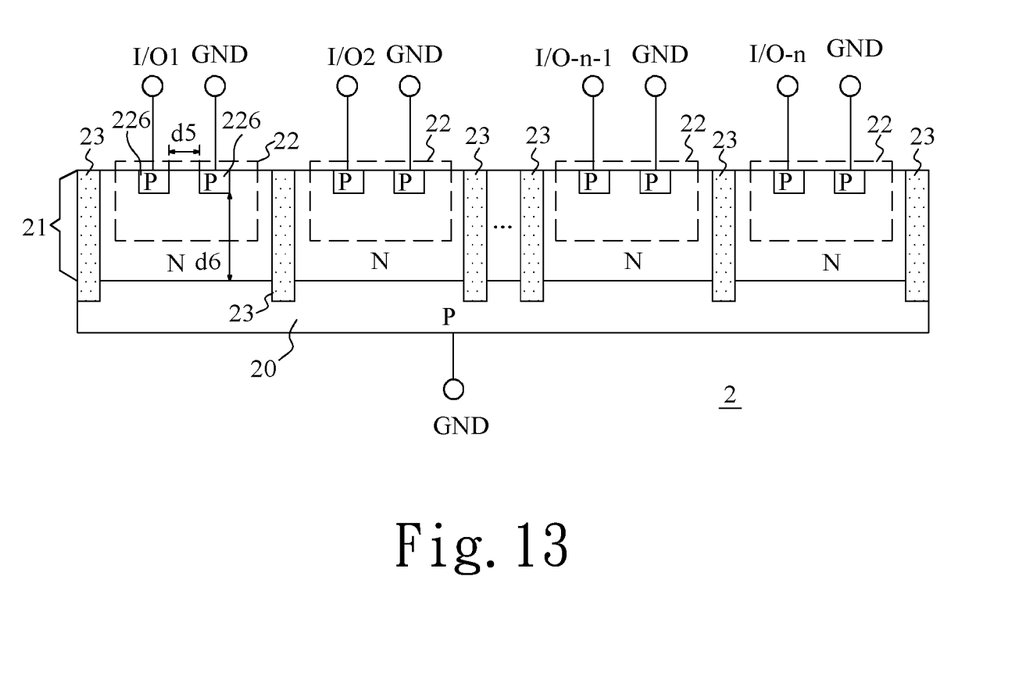
FIG. 13 is a diagram schematically illustrating a multi-channel transient voltage suppression device according to a tenth embodiment of the present invention.

FIG. 13 is a diagram schematically illustrating a multi-channel transient voltage suppression device according to a tenth embodiment of the present invention. Referring to FIG. 13, the tenth embodiment is different from the fourth embodiment in the conductivity type. In the tenth embodiment, the first conductivity type and the second conductivity type are respectively a P type and an N type. The other features of the tenth embodiment have been described previously so will not be reiterated.

Figure 14:
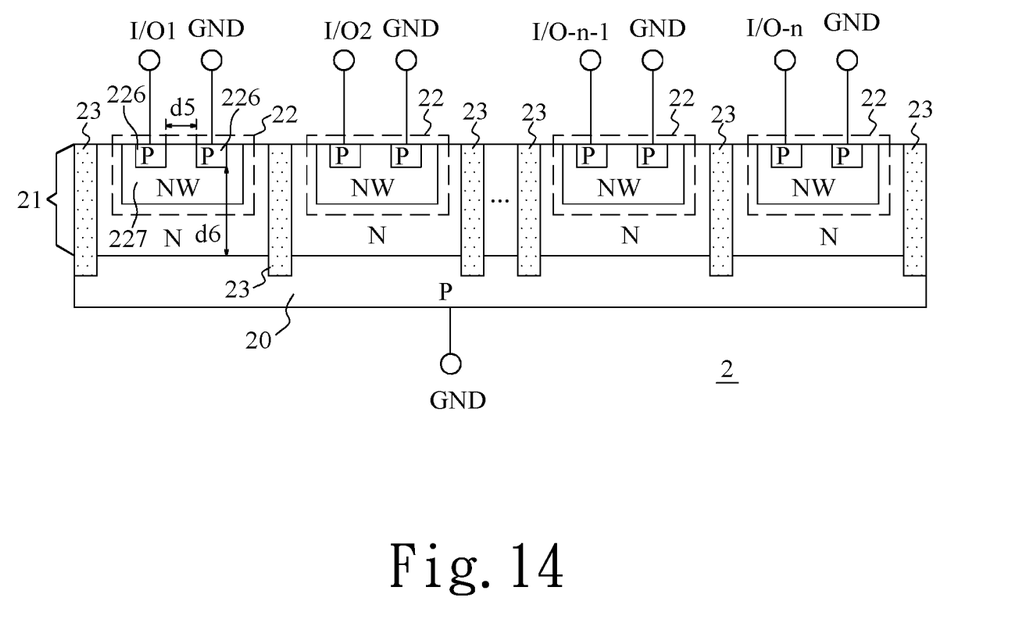
FIG. 14 is a diagram schematically illustrating a multi-channel transient voltage suppression device according to an eleventh embodiment of the present invention.

FIG. 14 is a diagram schematically illustrating a multi-channel transient voltage suppression device according to an eleventh embodiment of the present invention. Referring to FIG. 14, the eleventh embodiment is different from the fifth embodiment in the conductivity type. In the eleventh embodiment, the first conductivity type and the second conductivity type are respectively a P type and an N type. The other features of the eleventh embodiment have been described previously so will not be reiterated.

Figure 15:
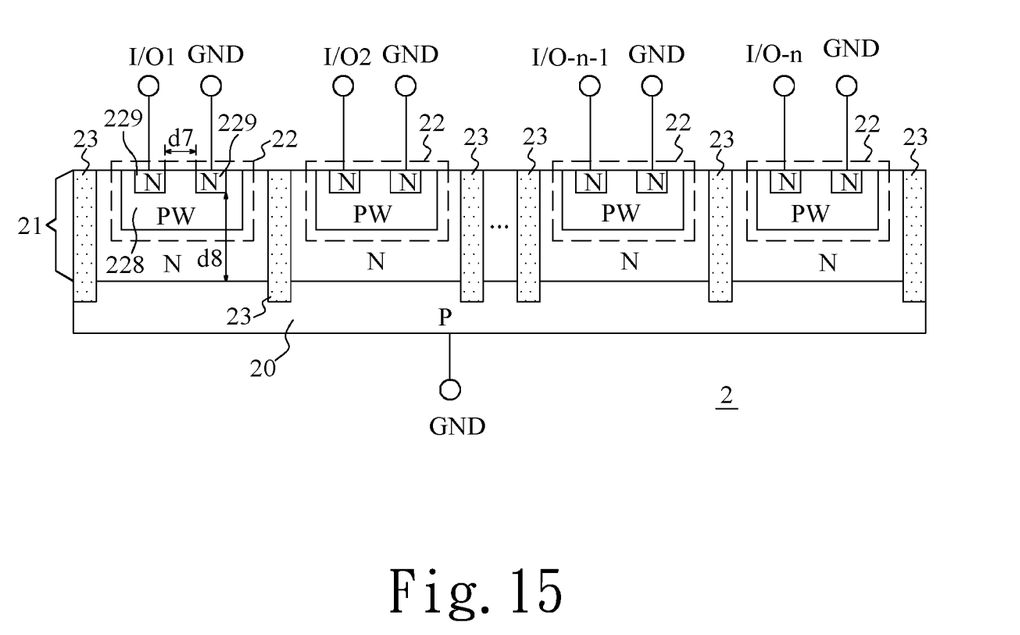
FIG. 15 is a diagram schematically illustrating a multi-channel transient voltage suppression device according to a twelfth embodiment of the present invention.

FIG. 15 is a diagram schematically illustrating a multi-channel transient voltage suppression device according to a twelfth embodiment of the present invention. Referring to FIG. 15, the twelfth embodiment is different from the sixth embodiment in the conductivity type. In the twelfth embodiment, the first conductivity type and the second conductivity type are respectively a P type and an N type. The other features of the twelfth embodiment have been described previously so will not be reiterated.

According to the embodiments provided above, the multi-channel transient voltage suppression device uses a single bidirectional transient voltage suppression structure to achieve a low-capacitance purpose and reduces a layout area, a serial resistance, and a cost without connecting to additional components in series. Besides, the multi-channel transient voltage suppression device forms the isolation trench to isolate the semiconductor layer and the shallower layer of the semiconductor substrate thereunder that is grounded, so as to reduce parasitic capacitances.

What is claimed is:

1. A multi-channel transient voltage suppression device comprising:
   a semiconductor substrate, having a first conductivity type, directly electrically grounded;
   a semiconductor layer, having a second conductivity type opposite to the first conductivity type, formed on the semiconductor substrate;
   at least two bidirectional transient voltage suppression structures formed in the semiconductor layer, wherein each of the at least two bidirectional transient voltage suppression structures is coupled to an input/output (I/O) pin and electrically grounded; and
   at least one isolation trench formed in the semiconductor substrate and the semiconductor layer and formed between the at least two bidirectional transient voltage suppression structures, wherein the at least one isolation trench has a height larger than a height of the semiconductor layer and surrounds the at least two bidirectional transient voltage suppression structures;
   each of the at least two bidirectional transient voltage suppression structures comprises:
   a first doped well, having the first conductivity type, formed in the semiconductor layer;

a first doped area, having the first conductivity type, formed in the first doped well;

a second doped area, having the second conductivity type, formed in the first doped well, wherein the first doped area and the second doped area are coupled to the I/O pin;

a second doped well, having the first conductivity type, formed in the semiconductor layer;

a third doped area, having the second conductivity type, formed in the second doped well; and a fourth doped area, having the first conductivity type, formed in the second doped well, wherein the third doped area and the fourth doped area are electrically grounded, wherein a shortest distance between the second doped area and the semiconductor substrate is larger than a shortest distance between the second doped area and the second doped well and configured to prevent from turning on a vertical silicon-controlled rectifier formed by the second doped area, the first doped well, the semiconductor layer, and the semiconductor substrate.

2. The multi-channel transient voltage suppression device according to claim 1, wherein a shortest distance between the third doped area and the semiconductor substrate is larger than a shortest distance between the third doped area and the first doped well.

3. The multi-channel transient voltage suppression device according to claim 1, wherein the first conductivity type and the second conductivity type are respectively an N type and a P type.

4. The multi-channel transient voltage suppression device according to claim 1, wherein the first conductivity type and the second conductivity type are respectively a P type and an N type.

* * * * *